(12) United States Patent
Ng et al.

(10) Patent No.: US 7,336,540 B2
(45) Date of Patent: Feb. 26, 2008

(54) INDIRECT MEASUREMENT OF NEGATIVE MARGIN VOLTAGES IN ENDURANCE TESTING OF EEPROM CELLS

(75) Inventors: Philip S. Ng, Cupertino, CA (US); Minh V. Le, Stockton, CA (US); Liqi Wang, Sunnyvale, CA (US); Jinshu Son, Saratoga, CA (US)

(73) Assignee: Atmel Corporation, San Jose, CA (US)

( * ) Notice: Subject to any disclaimer, the term of this patent is extended or adjusted under 35 U.S.C. 154(b) by 171 days.

(21) Appl. No.: 11/393,551

(22) Filed: Mar. 29, 2006

(65) Prior Publication Data

US 2007/0237013 A1    Oct. 11, 2007

(51) Int. Cl.
*G11C 11/34* (2006.01)
(52) U.S. Cl. .............................. 365/185.2; 365/185.23; 365/185.24
(58) Field of Classification Search ................ 365/201, 365/185.2, 185.23, 185.24, 185.11, 185.05, 365/185.18
See application file for complete search history.

(56) References Cited

U.S. PATENT DOCUMENTS

| | | | | |
|---|---|---|---|---|
| 5,781,489 A | * | 7/1998 | Okamoto | ................... 365/208 |
| 6,088,269 A | | 7/2000 | Lambertson | ............ 365/185.28 |
| 6,104,637 A | * | 8/2000 | Seo | ........................ 365/185.24 |
| 6,545,910 B2 | * | 4/2003 | Byeon et al. | .......... 365/185.17 |
| 6,687,648 B1 | | 2/2004 | Kumar et al. | ................ 702/181 |
| 6,693,829 B2 | * | 2/2004 | Babudri et al. | ........ 365/185.22 |
| 6,842,381 B2 | * | 1/2005 | Chih et al. | ............. 365/185.29 |

\* cited by examiner

*Primary Examiner*—Anh Phung
*Assistant Examiner*—Hien Nguyen
(74) *Attorney, Agent, or Firm*—Schneck & Schneck; Thomas Schneck (57) ABSTRACT

An electronic test structure and method for testing non-volatile memory cells. The structure includes a first transistor coupled in series to a floating gate transistor whereby a source of the first transistor is coupled to a positive power supply voltage and a source of the floating gate transistor is coupled to a power supply ground. A gate of the first transistor is further coupled to a source of the first transistor. A second transistor is coupled in series with a memory cell with a source of the second transistor coupled to a positive power supply voltage and a gate of the second transistor is coupled to the drain of the first transistor.

23 Claims, 4 Drawing Sheets

INDIRECT MEASUREMENT OF NEGATIVE MARGIN VOLTAGES IN ENDURANCE TESTING OF EEPROM CELLS

TECHNICAL FIELD

The invention generally pertains to memory integrated circuits (ICs). More specifically, the invention is a method and circuit for measuring a threshold voltage of an MOS transistor (e.g., a flash memory cell) having a negative threshold voltage, without a need to supply a negative potential to the gate of the device.

BACKGROUND ART

Nonvolatile memory ICs with higher densities are being introduced to the market daily. In order to achieve higher densities, IC manufacturers must continually decrease IC design rules (i.e., rules that state allowable dimensions of features used in the design and layout of integrated circuits). A smaller design rule relates directly to a reduced size of each cell of a memory array. With memory array cells already having deep submicron feature sizes, a slight change in processing of one memory cell relative to another during fabrication may result in a substantial difference in a behavior and characteristics of the cells with respect to one another.

Many conventional memory ICs operate in either a test mode in which input/output (I/O) pads are connected directly to an array of memory cells, or in a normal (or active) mode in which the I/O pads are connected through buffer circuitry to the array of memory cells. In the normal mode, the IC can perform read/write operations in which data are written to selected ones of the cells through an input buffer (or data are read from selected ones of the cells through an output buffer).

Figure 1:
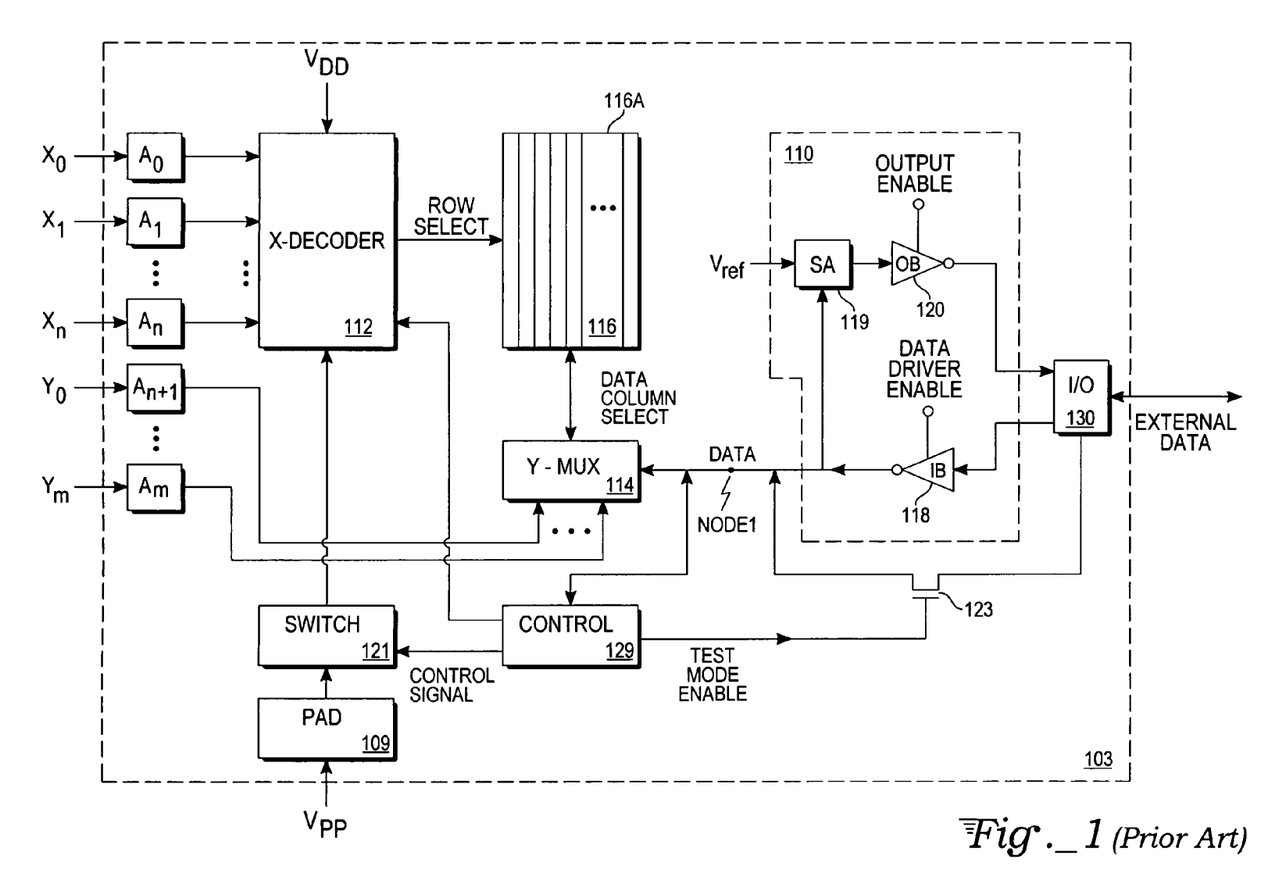
FIG. 1 is a simplified block diagram of a conventional prior art memory integrated circuit.

FIG. 1 is a simplified block diagram of a conventional prior art memory IC of this type. Although a thorough understanding of the conventional prior art memory IC presented herein is not required to appreciate embodiments of the present invention, it is nonetheless illustrative to fully appreciate the complexity and requirement of the present invention for testing memory cells.

A memory IC 103 of FIG. 1 includes at least one I/O pad 130 (for asserting output data to an external device or receiving input data from an external device), input/output buffer circuit 110 for the I/O pad 130, a test mode switch 123, a plurality of address buffers $A_0$ through $A_m$ for receiving memory address bits from an external device, a row decoder circuit (X-address decoder) 112, a column multiplexer circuit (Y-multiplexer) 114, a memory array 116 (comprising a plurality of columns of nonvolatile memory cells, such as a representative column 116A), a high voltage pad 109, a switch 121 connected between the high voltage pad 109 and other components of the memory IC 103, and a control unit 129. Each of address buffers $A_0$ through $A_m$ includes an address bit pad for receiving (from an external device) a different one of address bit signals $X_0$ through $X_n$ and $Y_0$ through $Y_m$. The I/O buffer circuit 110 includes a write branch and a read branch. The write branch includes an input buffer 118. The read branch includes a sense amplifier 119 and output buffer 120.

In the normal operating mode of the memory IC 103 of FIG. 1, the control unit 129 can cause the memory IC 103 to execute a write operation in which it receives data (to be written to the memory array 116) from an external device at the I/O pad 130, buffers the data in the write branch, and then writes the data to the appropriate memory cell. Also in this normal operating mode, the control unit 129 can cause the memory IC 103 to execute a read operation in which it amplifies and buffers data (that has been read from array 116) in the read branch, and then asserts these data to the I/O pad 130.

Figure 2:
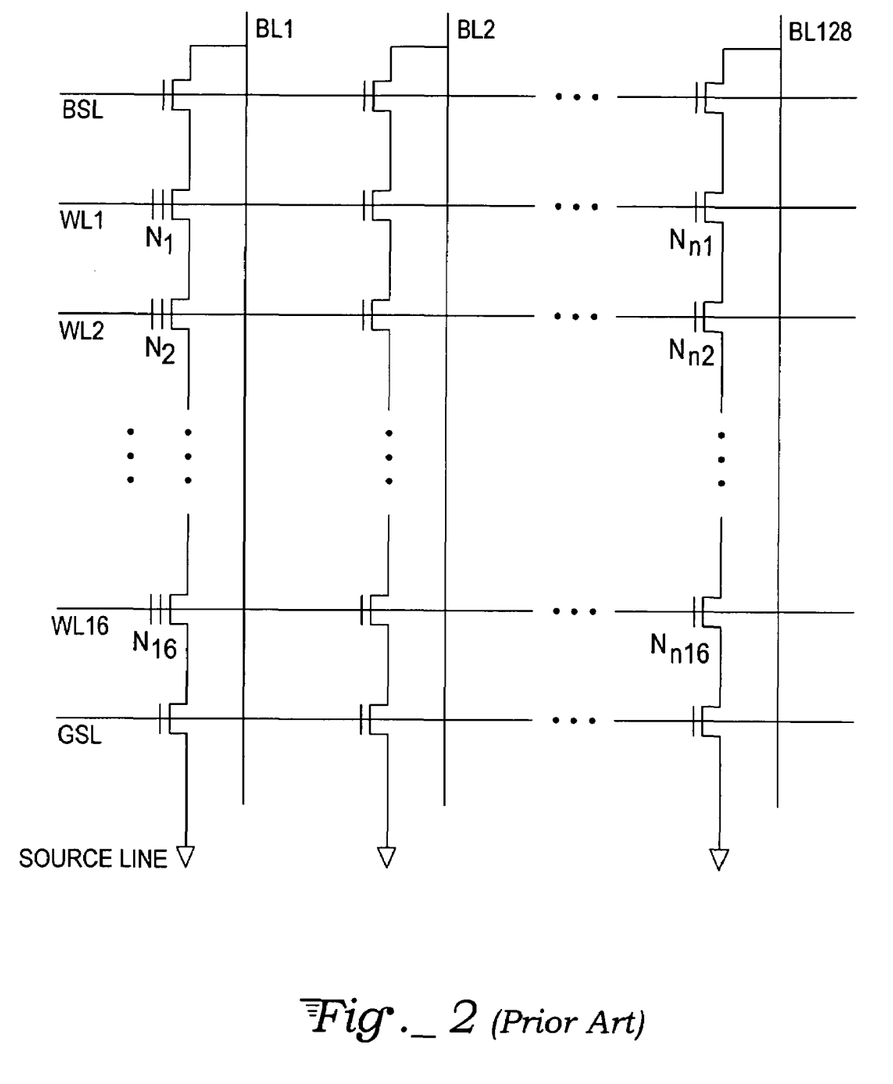
FIG. 2 is a simplified schematic diagram of columns of cells of the memory array of FIG. 1.

Each of the cells (storage locations) of the memory array circuit 116 is indexed by a row index (an "X" index determined by the row decoder circuit 112) and a column index (a "Y" index output determined by the column multiplexer circuit 114). FIG. 2 is a simplified schematic diagram of columns of cells of the memory array 116 (with one column, e.g., the column on the right, corresponding to column 116A of FIG. 1). The column on the left side of FIG. 2 comprises "n" memory cells, each cell implemented by a floating-gate N-channel transistor $N_1, N_2, \ldots, N_{16}$. Each of the transistors $N_1$-$N_{16}$ is connected in series with each other between a bitline BL1, a bit select transistor on the bit select line, a global select transistor on the global select line GSL, and a source line potential. A gate for each of the floating-gate transistors is connected to a different wordline, WL1-WL16. The column on the right side of FIG. 2 in bitline 128, BL128, also comprises "n" memory cells, each cell implemented by one of floating-gate N-channel transistors $N_{n1}, N_{n2}, \ldots, N_{n16}$. Each of the transistors in BL128 is connected similarly to the floating gate transistors, $N_1, N_2, \ldots, N_{16}$, of BL1.

Each memory cell is a nonvolatile memory cell since each of transistors $N_1, N_2, \ldots, N_{16}$, and $N_{n1}, N_{n2}, \ldots, N_{n16}$ has a floating gate capable of a semi-permanent charge storage. The current drawn by each cell (i.e., by each of transistors $N_1, N_2, \ldots, N_{16}$, and $N_{n1}, N_{n2}, \ldots, N_{n16}$) depends on an amount of charge stored on the cell's floating gate. Thus, the charge stored on each floating gate determines a data value that is stored semi-permanently in the corresponding cell. In cases in which each of transistors $N_1, N_2, \ldots, N_{16}$, and $N_{n1}, N_{n2}, \ldots, N_{n16}$ is a flash memory device, the charge stored on the floating-gate of each is erasable (and thus the data value stored by each cell is erasable) by appropriately changing the voltage applied to the gate and source. Each of the floating-gate transistors has two threshold voltages, (1) a threshold voltage associated with a programmed condition (i.e., logic "0"); and (2) a threshold voltage associated with an erased condition (i.e., logic "1"). In each case, the threshold voltage approximately defines the gate potential needed to convert the device from "off" to "on." Thus, a programmed cell can be "off" or "on" depending on the applied gate potential; and an erased cell can be "off" or "on" depending on the applied gate potential.

In response to address bits $Y_0$-$Y_m$, the column multiplexer circuit 114 (of FIG. 1) determines a column address which selects one of the columns of memory cells of the memory array 116 (connecting the bitline of the selected column to Node 1 of FIG. 1), and in response to address bits $X_0$-$X_n$, the row decoder circuit 112 determines a row address which selects one cell in the selected column.

With continued reference to FIG. 1, the function of the switch 123 is to switch the memory IC 103 between its test mode and its normal operating mode. In the normal operating mode (i.e., with the switch 123 "off"), the memory IC 103 circuit executes a write operation as follows. Each of the address buffers $A_0$ through $A_n$ asserts one of the bits $X_0$-$X_n$ to the row decoder circuit 112, and each of the address buffers $A_{n+1}$ through $A_n$ asserts one of the bits $Y_0$-$Y_m$ to the column multiplexer circuit 114. In response to these address bits, the column multiplexer circuit 114 determines a column address (which selects one of the columns of memory cells of the memory array 116, such as the representative column 116A), and the row decoder circuit 112 determines a row address (which selects one cell in the selected column). In response to a write command supplied from the control unit 129, a signal (indicative of data) present at the output of the input buffer 118 (which has been enabled by the appropriate level of the control signal "DATA DRIVER ENABLE") is asserted through the column multiplexer circuit 114 to a cell of the memory array 116 determined by the row and column address. During such a write operation, output buffer 120 is disabled (in response to an appropriate level of control signal OUTPUT ENABLE).

A data latch (not shown) is typically provided between the input buffer 118 and the I/O pad 130 for storing data (to be written to a memory cell) received from the I/O pad 130. When the latched data are sent to the input buffer 118, the input buffer 118 produces a voltage at Node 1 which is applied to the selected memory cell. The input buffer 118 is typically implemented as a tri-statable driver having an output which can be placed in a high impedance mode (and thus disabled) during a read operation. The input buffer 118 is disabled by asserting (to the input buffer 118) an appropriate level of the control signal DATA DRIVER ENABLE. In some implementations, the functions of the latch and the input buffer 118 are combined into a single device.

In the normal operating mode (with the switch 123 "off"), the FIG. 1 circuit executes a read operation as follows. Each of the address buffers $A_0$-$A_n$ asserts one of the bits $X_0$-$X_n$ to address the row decoder circuit 112, and each of the address buffers $A_n$-$A_m$ asserts one of the bits $Y_0$-$Y_m$ to the column multiplexer circuit 114. In response to these address bits, the column multiplexer circuit 114 asserts a column address to the memory array 116 (which selects one of the columns of memory cells, such as the representative column 116A), and the row decoder circuit 112 asserts a row address to the memory array 116 (which selects one cell in the selected column). In response to a read command supplied from the control unit 129, a current signal indicative of a data value stored in the cell of array 116 (i.e., a data signal) determined by the row and column address is supplied through the bitline of the selected cell and then through the column multiplexer circuit 114 to the sense amplifier 119. This data signal is amplified in the sense amplifier 119, buffered in the output buffer 120 (which is enabled by an appropriate level of control signal "OUTPUT ENABLE"), and finally asserted at the I/O pad 130. During such a read operation, the input buffer 118 is disabled (in response to an appropriate level of control signal DATA DRIVER ENABLE).

The memory IC 103 of FIG. 1 also includes a high voltage pad 109 which receives a high voltage $V_{pp}$ from an external circuit, such as a charge pump, and the switch 121 connected to the pad high voltage pad 109. During some steps of a typical erase or program sequence (in which the cells of the memory array 116 are erased or programmed), the control unit 129 sends a control signal to the switch 121, thereby causing the switch 121 to close, consequently asserting the high voltage $V_{pp}$ to various components of the IC including the row decoder 112. Voltage $V_{pp}$ is higher (e.g., typically $V_{pp}$=12 volts) than the normal operating mode supply voltage (e.g., $V_{DD}$=5 volts or $V_{DD}$=3.3 volts) for the MOS transistors of the memory IC 103.

When reading a selected cell of the memory array 116, if the cell is in an erased state, the cell will conduct a first current which is converted to a first voltage in the sense amplifier 119; if the cell is in a programmed state, it will conduct a second current which is converted to a second voltage in the sense amplifier 119, as discussed supra. The sense amplifier 119 determines the state of the cell (i.e., whether it is programmed or erased corresponding to a binary logic value of "0" or "1," respectively) by comparing the voltage indicative of the cell state to a reference voltage. An outcome of this comparison is an output which is either high or low (corresponding to a digital value of "0" or "1") which the sense amplifier 119 sends to the output buffer 120. The output buffer 120 in turn asserts a corresponding data signal to the I/O pad 130 (from which it can be accessed by an external device).

During a test mode, the input buffer 118, the sense amplifier 119, and the output buffer 120 are all disabled (in response to appropriate levels of their respective control signals DATA DRIVER ENABLE, SENSE AMPLIFIER ENABLE, and OUTPUT ENABLE, which are each generated by the control unit 129).

A complicated sequence of steps is necessary to perform an erase or program operation on the cells of a conventional nonvolatile memory IC as described since each of the individual cells typically behaves differently. Thus there is a need to ensure that all memory cells have at least a minimum margin at the end of each erase (or program) operation. This, however, does not mean that all the cells will be left with the same threshold voltage, $V_{th}$, at the end of an erase or program operation. For example, if during programming of all cells of an array, the minimum threshold voltage of all programmed cells is set to 3.3 volts, there may be many cells that have been programmed to a threshold voltage in a range from 5 to 5.5 volts at the end of the programming operation. So, there is a range of threshold voltages for the programmed cells. The same is true for an erase operation, and thus there is typically a range of threshold voltages for the erased cells.

Measuring a threshold voltage distribution of the cells of an array (after erase and program operations) is of great importance to memory manufacturers and designers. A degree of tightness of such a distribution is a good indicator of how well the memory elements have been processed (e.g., during fabrication of the IC).

One figure-of-merit, endurance, is the number of times that a memory cell (e.g., an EEPROM cell) can be erased and rewritten without corrupting data. An EEPROM cell will be cleared to a logic value of "1" ("off" cell) if charge is stored on the floating gate of the cell. The threshold voltage of a logic "1" cell is a positive voltage (e.g., typically approximately 2 to 3 volts). Read operations are relatively unlimited as they impose almost no stress on the cell. Therefore, endurance data apply only to program/erase cycles. Failure in a cell is defined as when a sense amplifier can no longer reliably differentiate logic state changes.

An EEPROM cell will be written to a logic "0" ("on" cell) if charge is cleared from the floating gate of the cell. The threshold voltage of a logic "0" cell is a negative voltage (e.g., typically approximately −1 to −2 volts). A margin voltage is measured to determine how well an EEPROM cell can be cleared and written. This margin voltage decreases with an increasing number of program/erase cycles. A margin "1" voltage is measured by applying a positive margin voltage to the sense gate of an EEPROM cell and raising the positive margin voltage until the "off" cell becomes an "on" cell. A positive margin voltage is input into a memory IC (such as the memory IC 103 of FIG. 1) by applying an external positive voltage through an I/O pad. In a similar way, it would be preferable to verify a margin "0" voltage which is measured by applying a negative margin voltage to the sense gate of the EEPROM cell and lowering the negative margin voltage until the "on" cell becomes an "off"

cell. A program operation clears electrons from the floating gate. Therefore, a program threshold voltage, $V_t$, is low (i.e., a gate voltage, $V_g$, is negative with respect to a source voltage). Therefore, in order to test program operations, a negative threshold voltage is applied to the gate.

Figure 3:
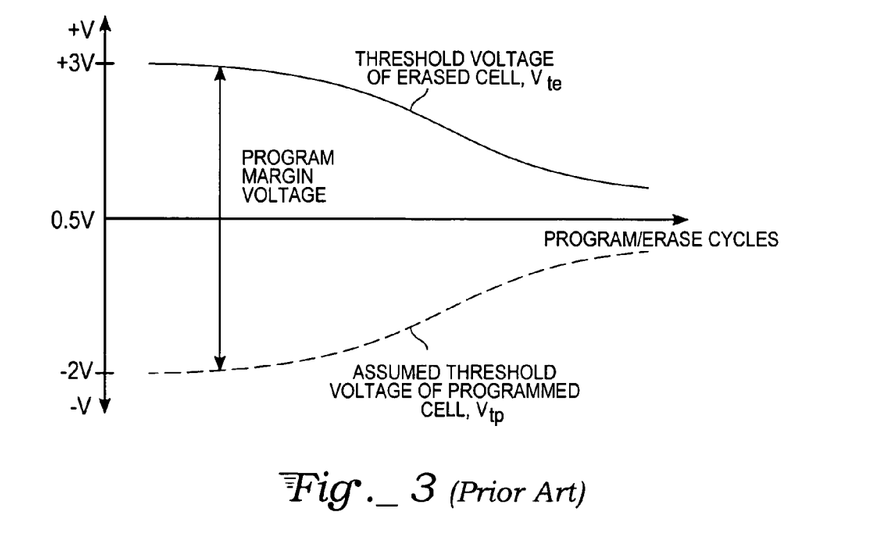
FIG. 3 is a prior art endurance-test and theoretical program margin voltage curve for individual memory cells of FIG. 2.

However, a typical electrostatic discharge (ESD) protection circuit on a test pad prohibits a negative voltage from being introduced. If a margin "0" voltage is less than approximately −0.6 volts, a p-n junction of the ESD circuit will be forward biased, potentially causing latchup. Therefore, usually only the positive margin voltage is tested and an assumption is made that the negative margin voltage will be symmetrically mirrored across the +0.5 voltage line (see FIG. 3). The theoretical program margin voltage of FIG. 3 indicates a threshold voltage of the erased cell, $V_{te}$, which will typically be a positive value, and an assumed threshold voltage of the programmed cell, $V_{tp}$, which will typically be a negative value. The difference between $V_{te}$ and $V_{tp}$ is the cell or program margin, $V_{pm}$, and is expressed as $$V_{pm} = |V_{tp} - V_{ref}|$$

where $V_{ref}$ is an on chip reference voltage. Otherwise, $$V_{pm} \approx |V_{tp}|$$

when $V_{ref} = 0$ volts.

The program margin should be as large as practical since it makes it easier to distinguish a programmed cell from an erased cell. In other words, it makes it easier to read a data content of the cell. However, an assumption of program margin symmetry stated supra for an unmeasured threshold voltage of the programmed cell may be unjustified.

Therefore, what is needed is a method and circuit to provide a complete endurance cycle testing of both positive and negative margin voltages.

SUMMARY OF THE INVENTION

Measurement of program margin is important for at least two primary reasons (1) relatively high program margin voltages decrease with time and thus give an initial figure-of-merit or relative health of a memory cell; and, related to the initial figure-of-merit, (2) a higher program margin voltage gives an indication of endurance or longevity of the cell.

Due to various wear-out mechanisms (e.g., due to oxide charge trapping) in memory cells (e.g., flash and EEPROM memory cells), the program margin decreases with each program/erase cycle. Over the course of many program/erase cycles, the margin is reduced to the point that the cell fails—the contents can no longer be read reliably. Therefore, measurement of the threshold voltage of programmed and erased memory cells is a useful indicator of cell reliability and endurance.

An embodiment of the present invention is, accordingly, an electronic test structure for testing non-volatile memory cells. The structure includes a first PMOS transistor coupled in series to a floating gate transistor whereby a source of the first PMOS transistor is coupled to a positive power supply voltage and a source of the NMOS floating gate transistor is coupled to a power supply ground. A gate of the first PMOS transistor is further coupled to a drain of the first PMOS transistor. A second PMOS transistor is coupled in series with a memory cell with a source of the second PMOS transistor coupled to a positive power supply voltage. A gate of the second PMOS transistor is coupled to the drain of the first PMOS transistor, thus forming a current mirror.

The present invention is also a method for testing electronic memory cells. The method includes making a determination of physical characteristics of the memory cell, selecting an electronic reference device having characteristics similar to the memory cell, and determining a ratio between the characteristics of the reference device and the memory cell (note that this ratio may be one for devices fabricated concurrently with similar design and ratioing rules). An externally provided variable voltage source is coupled to a terminal of the reference device and a fixed voltage source is coupled to a gate of the memory cell. A comparison is made of generated memory cell current with a generated current flowing through the reference device while varying a voltage potential of the externally provided variable voltage source until the memory cell current and the reference device current achieve a certain relationship, the certain relationship being determined by comparing the memory cell current with the reference device current. A calculation of a program margin voltage of the memory cell is made using the determined ratio, the voltage applied to the memory cell, and a final voltage applied to the reference device once a certain relationship is achieved.

DETAILED DESCRIPTION OF THE INVENTION

The present invention provides for indirectly measuring threshold voltages of programmed memory cells (e.g., Flash memory cells), thereby effectively allowing an accurate representation of margin voltages over time for both programmed cells, $V_{tp}$, and erased cells, $V_{te}$. Calculations presented are for illustrative purposes. Details in regard to mathematical expressions and relationships will vary based on particular circuit configurations or bias conditions that one skilled in the art would readily conceive of in consideration of equivalent situations relative to the present exemplary embodiment.

Figure 4:
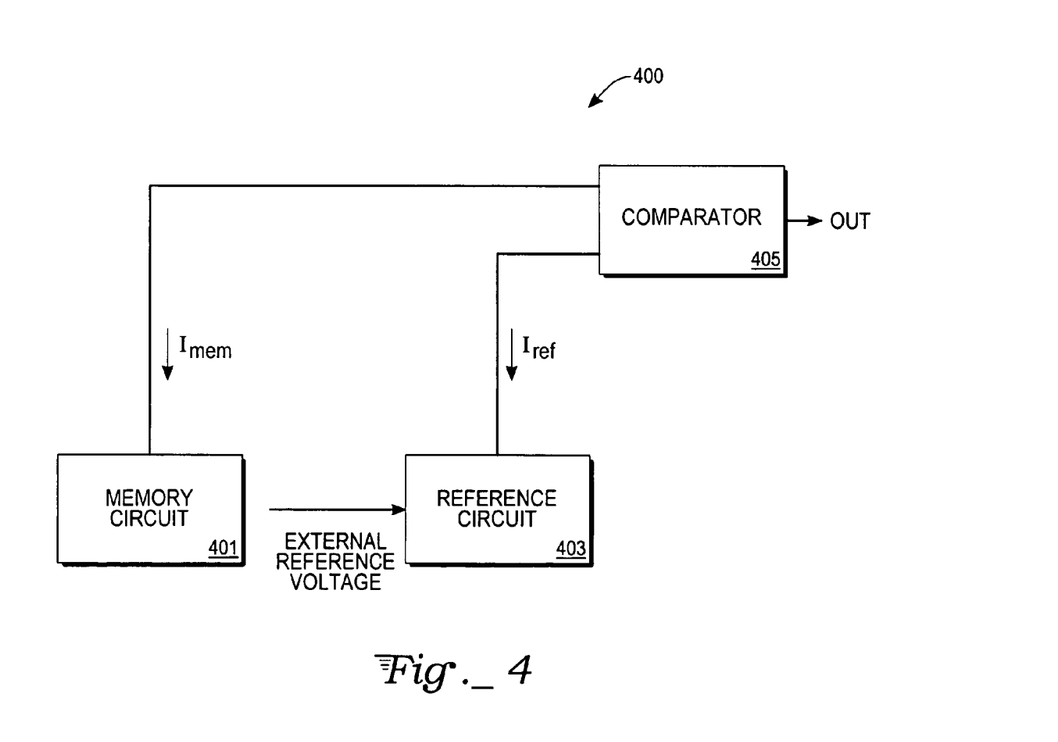
FIG. 4 is a block diagram of an exemplary embodiment of the present invention.

With reference to FIG. 4, a block diagram of an exemplary test setup 400 provides a high-level conceptual view of the present invention. The exemplary test setup 400 includes a memory circuit 401, a reference circuit 403, and a comparator 405. An external variable reference voltage is applied to the reference circuit 403 while a fixed positive voltage (e.g., 0.3 volts, not shown) is applied to the memory circuit 401. The memory circuit 401, in this embodiment, contains a floating gate memory cell but other test devices are contemplated. The memory circuit 401 and the reference circuit 403, in a specific exemplary embodiment, could be partially configured as a current mirror structure. The comparator 405, acting as a differential current sensor, compares a test current, $I_{mem}$, flowing through the device under test within the memory circuit block 401 with a reference current, $I_{ref}$, flowing through the reference circuit 403.

Measurement of a threshold voltage on a programmed cell within the memory circuit 401 involves a "virtual" application of a gate potential to the cell which varies from zero volts to increasingly negative voltages. At zero volts, the programmed cell will be in a conducting state. As the potential approaches a negative threshold voltage, the cell will transition to a non-conduction state. However, a negative voltage cannot actually be applied to the memory cell since a negative voltage (in excess of roughly −0.7 volts) will force a forward bias condition of a p-n junction of the memory circuit or other circuit of the device.

Therefore, this embodiment of the present invention measures a threshold voltage of a programmed cell indirectly. In this embodiment, the approach involves applying a known potential as the external reference voltage to the reference circuit 403. For example, the external reference voltage may be set to zero volts. The memory cell in the memory circuit 401 will then conduct current, $I_{mem}$, in proportion to a threshold voltage of the programmed cell. The current in the memory circuit 401 branch, $I_{mem}$, is compared with current in the reference circuit 403 branch, $I_{ref}$. Assuming the reference circuit 403 has a known positive threshold voltage $V_{t,\,ref}$, a positive external reference voltage is applied to the reference circuit 403 until the current $I_{ref}$ in the reference circuit 403 matches the current $I_{mem}$ in the cell of the memory circuit 401.

The current matching is detected by means of the comparator 405, which compares the current $I_{ref}$ in the reference circuit 403 to the current $I_{mem}$ in the memory circuit 401. When the current $I_{ref}$ in the reference circuit 403 equals or exceeds the current $I_{mem}$ through the memory circuit 401, an output of the comparator 405 will transition, thereby indicating an equivalent threshold voltage of the programmed cell. This concept will be described in more detail with reference to FIGS. 5 and 6, infra.

Figure 5:
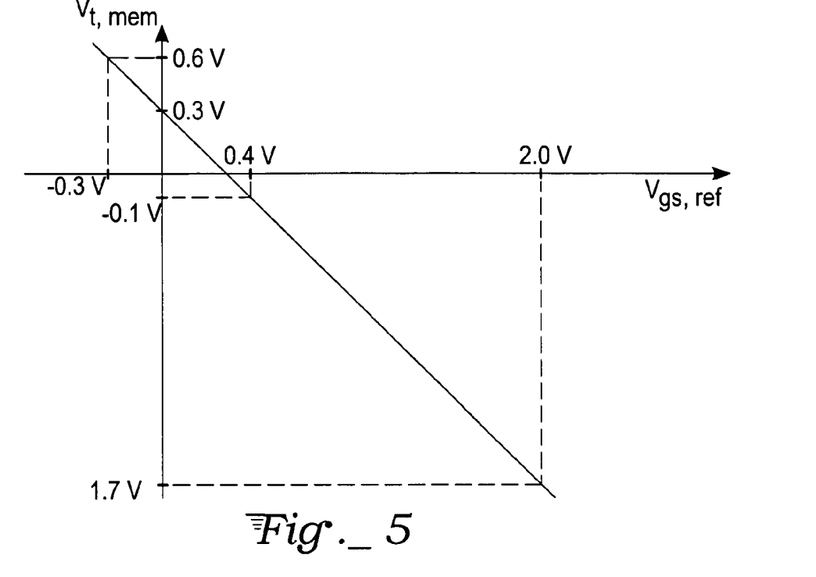
FIG. 5 is a graph exemplifying a linear relationship of a positive reference voltage relating to a threshold voltage of a cell under test.

FIG. 5 graphically explains the "inverse relationship" between voltages applied to the memory circuit 401 and the reference circuit 403 (FIG. 4), as well as to another exemplary test circuit to be described with reference to FIG. 6, infra. Effectively, an external voltage applied to the reference circuit 403 is used to determine a threshold voltage of a programmed cell (i.e., the same as applying a negative external voltage to the gate of the cell within the memory circuit 401). As indicated, the abscissa of the graph in FIG. 5 indicates reference voltage, $V_{gs,\,ref}$ (gate voltage with respect to source voltage) applied to a gate of a transistor (e.g., a memory cell in the reference circuit 403 with a known threshold voltage) in the reference circuit 403. The ordinate axis of the graph indicates a threshold voltage, $V_{t,\,mem}$, of the programmed cell since an assumed linear relationship between the memory circuit 401 and the reference circuit 403 exist. These concepts, along with a validity check for the assumed linear relationship, will be further explained with regard to the governing equations discussed infra.

Figure 6:
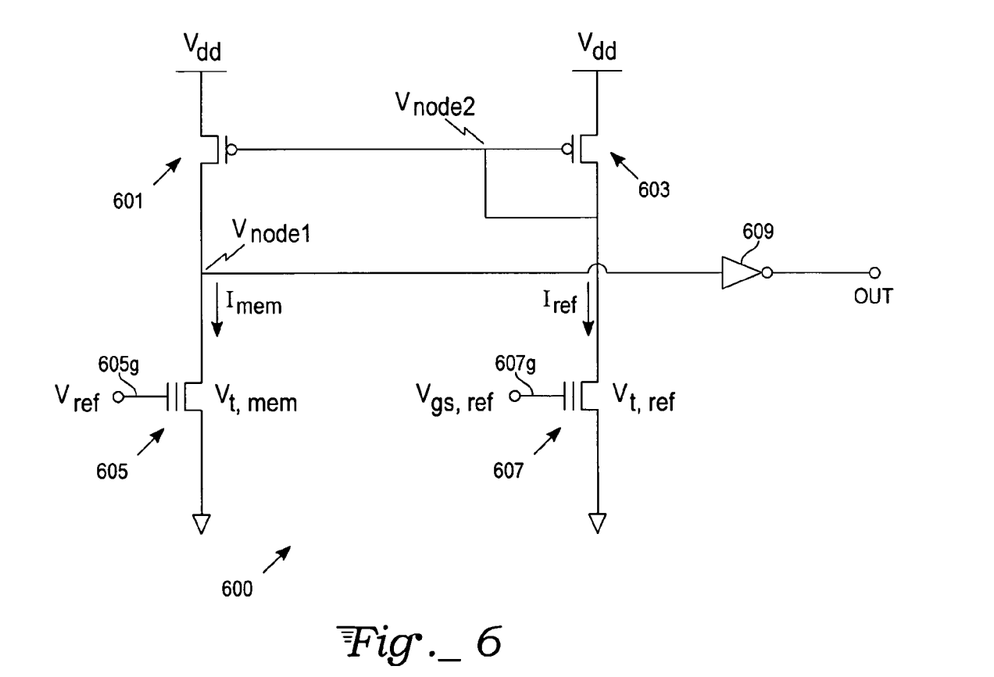
FIG. 6 is an exemplary program margin test circuit.

With reference to FIG. 6 (and continued reference to FIG. 5), an exemplary test circuit 600 includes a first PMOS transistor 601, a second PMOS transistor 603, a memory cell device under test (DUT) 605, a reference transistor 607, and a sense amplifier 609. The DUT cell 605 and the reference transistor 607 each have a gate terminal 605g, 607g. Additionally, the reference transistor 607 has a known (i.e., measured) threshold voltage, $V_{t,\,ref}$. The reference transistor gate 607g may be connected directly to an external pin of an IC (not shown). A gate voltage, $V_{gs,\,ref}$, which varies from zero volts to an increasingly positive value, applied to the reference transistor gate 607g, determines at what point a cell (i.e., the DUT cell 605) transitions from a conducting mode to a non-conduction mode.

As discussed supra, measurement of $V_{tp}$ (FIG. 3) conceptually involves an application of a gate potential to the DUT cell 605 which varies from zero volts to increasingly negative voltages. At zero volts, the programmed cell will be in a conducting state. As the potential approaches a negative threshold voltage, the cell will transition to a non-conducting state. However, for reasons already discussed herein, a negative voltage typically cannot be applied to the DUT cell gate 605g. Therefore, direct measurement of $V_{tp}$ is not possible. A forward bias effect on a negative voltage applied to a p-n junction in the ESD structures of standard I/O pads (not shown) prevents an introduction of negative voltages through the pad. If a negative voltage is applied, a p-n junction will be forward biased at approximately −0.6 to −0.7 volts, shunting the input potential to about −0.6 volts to −0.7 volts.

Therefore, this embodiment of the present invention measures a threshold voltage, $V_{tp}$, of a programmed DUT cell 605 indirectly. In this embodiment, the approach involves applying a known potential, $V_{ref}$, on the DUT cell gate 605g. $V_{ref}$ may be set to, for example, zero volts (this voltage may be obtained directly from a reference cell, not shown). The DUT cell 605 will then conduct current, $I_{mem}$, in proportion to $V_{tp}$. The current in the DUT branch, $I_{mem}$, is compared with current in the reference transistor branch, $I_{ref}$. Recall, the reference transistor 607 has a known positive threshold voltage $V_{t,\,ref}$. A positive potential $V_{gs,\,ref}$ is applied to the reference transistor gate 607g until the current $I_{ref}$ in the reference transistor 607 matches the current $I_{mem}$ in the DUT cell 605.

The current matching is detected by means of the sense amplifier 609, which compares the current $I_{ref}$ in the reference transistor 607 to the current $I_{mem}$ in the DUT cell 605. When the current $I_{ref}$ in the reference cell 607 equals or exceeds the current $I_{mem}$ in the DUT cell 605, an output of the sense amp 609 will transition from reporting an "on" (data "0") to an "off" (data "1") output.

To more fully illustrate, when the sense amplifier 609 output transitions, $I_{mem}=I_{ref}$ (i.e., the DUT cell 605 current is equal to the reference transistor 607 current). Since the DUT cell 605 current is proportional to the voltage difference (i.e., $I_{mem} \propto 0-V_{tp}$ for $V_{Ref}=0$ volts), and the reference transistor 607 current is proportional to the applied gate voltage minus the threshold voltage (i.e., $I_{ref} \propto V_{gs,ref}-V_{t,ref}$), and $V_{t,\,ref}$ and $V_{gs,\,ref}$ are known, the inference $$I_{mem}=I_{ref}$$
$$\therefore V_{tp} \approx V_{t,ref}-V_{gs,ref}$$

is valid if $V_{ref}=0$ volts. For the same type of floating gate device, the proportionality constant is the same. Therefore, $V_{tp}$ is known. As described supra, the value $V_{tp}$ is derived by an application of a positive potential, $V_{gs}$, to the reference transistor gate 607g. The program margin, $V_{pm}$, is then computed as $$V_{pm}=|V_{tp}|=|V_{t,ref}-V_{gs,ref}|$$

if $V_{ref}=0$ volts.

As is known in the art, a margin of approximately 2 volts for a new memory cell device is typically sufficient to assure a lifetime of 10,000 program/erase cycles. Since $V_{t,\,mem}=V_{tp}$ for a programmed cell, $V_{gs,\,ref}=V_{t,\,ref}-V_{t,\,mem}$.

Since $V_{t, mem}$ would ordinarily require a negative voltage applied to the gate of the DUT cell 605 to determine the threshold voltage of a programmed cell (which, as discussed supra with reference to FIG. 3, is not possible), the exemplary test circuit 600 allows a positive voltage, $V_{gs, ref}$, to be applied to the gate 607*g* of the reference transistor 607. In other words, $V_{t, mem}$ is considered to be a negative quantity. Subtracting this negative quantity from a positive $V_{t, Ref}$ (referring back to the last equation, supra) ensures a positive voltage being applied to the gate 607*g* of the reference transistor 607. By setting $I_{mem}=I_{ref}$, the comparator, here the sense amplifier 609, can compare and consequently determine the appropriate negative voltage that would be required to be applied to the gate 405*g* of the DUT 405.

Although the present invention is described herein in terms of specific exemplary embodiments, a skilled artisan will realize that other forms of the test circuit and method may be implemented and still be within a scope of the appended claims. For instance, the preceding calculations are illustrative of an exemplary situation. Detailed expressions and relationships will vary with circuit configurations and bias conditions. For example, the first 601 and second 603 transistors may be both implemented as either NMOS or PMOS transistors. A particular selection of device types means gate voltages and threshold magnitudes will vary accordingly. Therefore, a scope of embodiments of the present invention should be considered in light of the appended claims.

What is claimed is:

1. An electronic structure for testing non-volatile memory cells, the structure comprising:
    a first transistor coupled in series to a floating gate transistor, a source of the first transistor being configured to be coupled to a positive power supply voltage and a source of the floating gate transistor being configured to be coupled to a power supply ground, a gate of the first transistor further coupled to a drain of the first transistor; and
    a second transistor configured to be coupled in series with a memory cell, a source of the second transistor being configured to be coupled to a positive power supply voltage and a gate of the second transistor being configured to be coupled to the drain of the first transistor.

2. The electronic structure of claim 1 wherein a gate of the floating gate transistor is structured to accept coupling to a variable external positive voltage supply.

3. The electronic structure of claim 1 wherein a sense amplifier is coupled to the source of the second transistor.

4. The electronic structure of claim 1 wherein the first and second transistors are each PMOS devices.

5. The electronic structure of claim 1 wherein the floating gate transistor is an NMOS device.

6. The electronic structure of claim 1 wherein the floating gate transistor has a known voltage threshold.

7. The electronic structure of claim 1 wherein a gate of the memory cell is held at a known voltage while testing.

8. A method for testing electronic memory cells, the method comprising:
    determining physical characteristics of the memory cell;
    selecting an electronic reference device having characteristics similar to the memory cell;
    determining a ratio between the characteristics of the reference device and the memory cell;
    coupling an externally provided variable voltage source to a terminal of the reference device;
    coupling a fixed voltage source to a gate of the memory cell;
    comparing a generated memory cell current with a generated current flowing through the reference device;
    varying a voltage potential of the externally provided variable voltage source until the memory cell current and the reference device current achieve a certain relationship, the certain relationship being determined by comparing the memory cell current with the reference device current; and
    calculating a programmed threshold voltage of the memory cell using the determined ratio, the voltage applied to the memory cell, and a final voltage applied to the reference device once a certain relationship is achieved.

9. The method of claim 8 wherein the step of varying the voltage potential until the certain relationship achieved is determined by having the memory cell current and the reference device current equal in magnitude.

10. The method of claim 8 wherein the reference device is selected to be a floating gate device.

11. The method of claim 8 further including determining the threshold voltage of the reference device.

12. The method of claim 8 wherein the step of comparing the memory cell current with the reference device current is accomplished utilizing a sense amplifier.

13. The method of claim 8 wherein the step of varying a voltage potential of the externally provided variable voltage source involves varying a positive voltage potential.

14. The method of claim 8 wherein the step of calculating a program margin voltage of the memory cell under test further comprises calculating a difference in voltage between a threshold value of an erased cell and a threshold voltage of a programmed cell.

15. The method of claim 14 wherein the threshold voltage of the programmed cell is calculated as the difference between a measured threshold voltage of the reference device and a voltage of the externally provided variable voltage source when the memory cell current and the reference device current are at least equal in magnitude.

16. The method of claim 8, further comprising applying a potential of zero volts to a gate of the electronic memory cell under test.

17. The method of claim 8, further comprising applying a potential of 0.3 volts to a gate of the electronic memory cell under test.

18. An electronic structure for determining a threshold voltage of a programmed non-volatile memory cell, the structure comprising:
    a first transistor coupled in series to a floating gate transistor, a source of the first transistor being configured to be coupled to a positive power supply voltage and a source of the floating gate transistor being configured to be coupled to a power supply ground, a gate of the first transistor further coupled to a drain of the first transistor, a gate of the floating gate transistor is structured to accept coupling to a variable external positive voltage supply;
    a second transistor configured to be coupled in series with the memory cell, a source of the second transistor being configured to be coupled to a positive power supply voltage and a gate of the second transistor being configured to be coupled to the drain of the first transistor; and
    a sense amplifier coupled to the drain of the second transistor.

19. The electronic structure of claim 18 wherein the first and second transistors are each PMOS devices.

20. The electronic test structure of claim 18 wherein the floating gate transistor is an NMOS device.

21. The electronic test structure of claim 18 wherein the floating gate transistor has a known voltage threshold.

22. The electronic test structure of claim 18 wherein a gate of the memory cell is held at a known voltage while testing.

23. The electronic test structure of claim 18 wherein a gate of the memory cell is held at a potential of 0.3 volts while testing.

* * * * *

UNITED STATES PATENT AND TRADEMARK OFFICE
CERTIFICATE OF CORRECTION

PATENT NO. : 7,336,540 B2 Page 1 of 1
APPLICATION NO. : 11/393551
DATED : February 26, 2008
INVENTOR(S) : Ng et al.

It is certified that error appears in the above-identified patent and that said Letters Patent is hereby corrected as shown below:

In column 2, line 64, delete "through $A_n$" and insert -- through $A_m$ --, therefor.

Signed and Sealed this

Fourteenth Day of October, 2008

JON W. DUDAS
*Director of the United States Patent and Trademark Office*